US008633583B2

(12) United States Patent
Ziglioli et al.

(10) Patent No.: US 8,633,583 B2
(45) Date of Patent: Jan. 21, 2014

(54) SEMICONDUCTOR PACKAGE SUBSTRATE AND METHODS FOR FORMING SAME, IN PARTICULAR FOR MEMS DEVICES

(75) Inventors: Federico Giovanni Ziglioli, Milan (IT); Giovanni Graziosi, Penne (IT); Mark Andrew Shaw, Milan (IT); Mario Francesco Cortese, Milan (IT); Conrad Max Cachia, Tarxien (MT)

(73) Assignees: STMicroelectrics S.r.l., Agrate Brianza (IT); STMicroelectronics (Malta) Ltd., Kirkop (MT)

( * ) Notice: Subject to any disclaimer, the term of this patent is extended or adjusted under 35 U.S.C. 154(b) by 505 days.

(21) Appl. No.: 11/879,239

(22) Filed: Jul. 16, 2007

(65) Prior Publication Data
US 2008/0128891 A1   Jun. 5, 2008

(30) Foreign Application Priority Data

Jul. 14, 2006   (EP) ..................................... 06014651

(51) Int. Cl.
*H01L 23/04*   (2006.01)

(52) U.S. Cl.
USPC ........... 257/698; 257/692; 257/684; 257/773; 257/703; 257/E21.011; 257/E23.067; 257/E23.174; 438/125; 438/667

(58) Field of Classification Search
USPC ............ 257/698, E23.19, E21.505, 692, 684, 257/702, 707, 773, E23.011, E23.067, 257/E23.174; 438/125, 667
See application file for complete search history.

(56) References Cited

U.S. PATENT DOCUMENTS

| 6,281,571 | B1 | 8/2001 | Takashima et al. | |
|---|---|---|---|---|
| 6,400,010 | B1 * | 6/2002 | Murata | 257/706 |
| 2001/0038905 | A1 * | 11/2001 | Takada et al. | 428/209 |
| 2002/0096760 | A1 * | 7/2002 | Simelgor et al. | 257/723 |
| 2002/0117751 | A1 * | 8/2002 | Crane et al. | 257/734 |
| 2003/0089923 | A1 * | 5/2003 | Oida et al. | 257/200 |
| 2004/0058477 | A1 | 3/2004 | Li et al. | |
| 2005/0146018 | A1 | 7/2005 | Jang et al. | |
| 2006/0001179 | A1 * | 1/2006 | Fukase et al. | 257/778 |
| 2006/0091523 | A1 * | 5/2006 | Shimanuki | 257/698 |

FOREIGN PATENT DOCUMENTS

EP   1365450 A   11/2003

OTHER PUBLICATIONS

European Patent Office, European Search Report, Dec. 18, 2006, Application No. EP 06 01 4651, 2 pages.
Soucy, J.W., et al. "An Approach to MEM Sensor Array Packaging," Proceedings of the SPIE, SPIE, Bellingham, VA, U.S. vol. 4339, pp. 768-771, Sep. 18, 2000, ISSN: 0277-786X.

* cited by examiner

*Primary Examiner* — Kimberly Rizkallah
*Assistant Examiner* — Maria Ligai
(74) *Attorney, Agent, or Firm* — Graybeal Jackson LLP

(57) ABSTRACT

A semiconductor package substrate suitable for supporting a damage-sensitive device and a package substrate core having an upper and a lower surface. At least one pair of metal layers coats the upper and lower surfaces of the package substrate core. One pair of solder mask layers coats the outer metal layers of the at least one pair of metal layers. A plurality of vias is formed across the package substrate core and the at least one pair of metal layers. Advantageously, the plurality of vias is substantially distributed according to a homogeneous pattern in an area that is to be covered by the damage-sensitive device. A method for the production of such semiconductor package substrate is also described.

23 Claims, 4 Drawing Sheets

US 8,633,583 B2

SEMICONDUCTOR PACKAGE SUBSTRATE AND METHODS FOR FORMING SAME, IN PARTICULAR FOR MEMS DEVICES

PRIORITY CLAIM

This application claims the benefit of European Patent Application No. 06014651.1, filed Jul. 14, 2006, which application is incorporated herein by reference in its entirety.

TECHNICAL FIELD

Embodiments of the present disclosure generally relate to semiconductor package substrates and manufacturing methods thereof.

More in particular, but not exclusively, embodiments of the present disclosure relate to a land grid array (LGA) and ball grid array (BGA) semiconductor package substrate supporting a micro-electro-mechanical system (MEMS) device, and the following description is made with reference to such a specific technical field for the sole purpose of simplifying the present disclosure.

BACKGROUND

As it is well known, a micro-electro-mechanical system (MEMS) device is a microdevice that integrates mechanical and electrical functions in a silicon chip realized using lithographic microfabrication techniques.

The final device is typically composed of a MEMS die and optionally ASICs assembled on top of an organic substrate (e.g., a BT resin) using standard assembly processes. The assembly thus formed is then encapsulated in a resin (molding compound) using standard injection molding technologies.

In fact, it is well known that integrated circuits (IC) are fabricated on the surface of a semiconductor wafer in layers and later singulated into individual semiconductor devices, or "dice." Since the material of a semiconductor wafer—commonly silicon—tends to be relatively fragile and brittle, dice are usually assembled into protective housings, or "packages," before being interconnected with a printed circuit board (PCB), the package ensuring the interconnection between the dice and the board.

In the case of MEMS devices, bulk type packages are generally used, such as SO, QFN, cavity (plastic or ceramic).

Metal layers include patterns of conductive material (usually copper) that are vertically insulated from one another by alternating layers of insulating or dielectric material. Conductive traces are also separated within each layer by an insulating, or dielectric, material. Vertical, conductive tunnels called "vias" typically pass through insulating layers to form conductive pathways between adjacent conductive patterns, such vias thus providing the electrical connection between the metal layers.

Such vias are to be provided in the package substrate of a die or a MEMS device in order to ensure a correct signal transmission between different metal layers.

Commonly used in the field are land grid array (LGA) packages wherein a die is mounted on a package substrate and enclosed in a homogenous material molding compound.

The LGA package is so named because the package substrate has an array of electrical contact pads, or "lands," arranged in a grid pattern on its underside. The lands are brought into electrical contact with the printed circuit board (PCB) generally by vias having polymer interposers, metal tracks or other electrically conductive element for contacting both the lands and the appropriate conductive portions of the PCB below. The PCB is substantially a support board for mounting the LGA/BGA packages, in connection in particular with their package substrates.

Owing to their structure, LGA packages are highly desirable in those cases where size reduction, performance and cost issues are particularly important.

The upper surface of a package substrate is surmounted by the silicon die, for example a MEMS device, which can be connected to the pads or to the bond fingers on the top metal layer of the land grid array by wire-bonding. Normally, the die is attached to the package substrate 10 with the aid of an adhesive material such as a glue or a tape.

The semiconductor devices (e.g., MEMS) can be found in a variety of relations with respect to each other on the integrated circuit, depending on the type of stacking configuration that applies. The devices can thus be found to be side by side, stacked, inversely stacked, etc.

The semiconductor device is normally encapsulated with a protecting material (normally epoxy resin), or cap or molding compound, to ensure electrical and mechanical protection, in general, as well as to protect against moisture, dust, and other external agents.

As well as constituting the mechanical support of the die or MEMS device, the package substrate also has a fundamental role from the electrical point of view.

A standard package substrate 10 is schematically shown in FIG. 1.

The substrate 10 is made of a polymeric material (for example, BT resin) core 4 and comprises a top 3a and a bottom copper layer 3b surrounding the core 4 as well as a top 2a and a bottom copper layer 2b on the copper layers 3a and 3b, in turn surrounded by a top 1a and a bottom solder-mask 1b.

The number of layers that can be used in the composition of package substrates 10 is variable.

For a two-layer LGA/BGA substrate, standard thickness values are in the range of 180 to 300 μm, wherein the core is approximately 100 μm or 200 um, each copper layer is 12-28 μm, and each solder mask layer is approximately 25 μm in thickness.

In the example shown in FIG. 1, vias are realized by plated through holes or PTH 8 drilled in the core 4 to provide electrical connections between the two copper layers.

An alternative package substrate is shown in FIG. 2, the package substrate 10 including vias in pad or VIP 9. As it is well known, according to the via-in-pad approach, the via is directly placed on the lands of the LGA substrate. The VIP 9 are usually drilled and copper plated, and then filled with a solder mask.

Typical dimensions of vias are in the range of 100 to 200 μm in diameter.

The number of vias that are usually formed in the substrate varies according to need and, similarly, their distribution is dependent upon factors such as routing complexity, package or substrate sizes and, in general, design requirements and constraints.

Along the production line, the assembly of the package can represent quite a critical step for a sensitive electronic device, such as MEMS. The package, in fact, can undergo considerable mechanical stresses, especially during the molding step, which can lead to failure by delamination of the cap, and consequent loss of the sealing effect, which in turn affects the quality of performance, in terms of offset stability and drift of the package, upon use.

In order reduce this technical problem, the package substrate should be of a physical structure such that the metal layers are well-balanced, so that, throughout the production steps, it is less exposed to those mechanical stresses which are damaging to the package itself.

Such balancing, in fact, enables smoother assembly steps on the substrate and thus leads to the production of a package of longer durability and better long-term performance.

For this purpose, it is common, for example, to balance the copper layers by means of a copper mesh. Such meshes can have variable sizes, patterns and widths, and can be suitably chosen to match the specific requirements of the package substrate.

Other known solutions comprise package substrates having an increased thickness in order to enhance their tolerance to the production processes usually employed in the field. In this case, however, the total thickness of the package is also increased, which is obviously undesirable.

Moreover, in the case of devices that are especially sensitive to the mechanical stresses of the assembly step, in particular the molding step, such as the MEMS devices, such known solutions are still not sufficient to ensure effective balancing and an optimal final packaged device.

Ideally, a package substrate would be capable of withstanding the mechanical stresses of assembly, in particular of the molding step.

SUMMARY

According to one embodiment of the present disclosure, a semiconductor package substrate suitable for supporting a damage-sensitive device includes a package substrate core having an upper and a lower surface. At least one pair of metal layers coats the upper and lower surfaces of the package substrate core.

One pair of solder mask layers coats the outer metal layers of the at least one pair of metal layers. A plurality of vias are formed across the package substrate and the at least one pair of metal layers. The plurality of vias is substantially distributed according to a homogeneous pattern in an area that is to be covered by the damage-sensitive device.

According to another embodiment of the present disclosure, a method for the production of a semiconductor package substrate suitable for supporting a damage-sensitive device includes providing a package substrate core having an upper and a lower surface, depositing at least one pair of metal layers on the upper and lower surfaces of the package substrate core, forming a plurality of vias formed through the substrate package core and the at least one pair of metal layers, and depositing one pair of solder mask layers on the outer layers of the at least one pair of metal layers. The step of forming the plurality of vias distributes the plurality of vias substantially according to a homogeneous pattern in an area that is to be covered by the damage-sensitive device.

By distributing the vias according to the patterns of embodiments of the disclosure, the package substrate is considerably more balanced and stable upon assembly, so that the device is less exposed to delamination, stresses and consequent loss of performance quality upon use.

Features and advantages of the package substrate and method of forming such a substrate according to embodiments of the disclosure will appear clearer from the description that follows and here provided for illustrative and non-limiting purposes with reference to the figures below.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

With reference to such figures, and in particular with reference to FIGS. 3 to 6, a package substrate according to one embodiment of the present disclosure, referred to in its entirety by reference number 20, will now be described in greater detail also by means of three representative examples concerning package substrates intended to support damage-sensitive devices, such as MEMS devices.

Figure 1:
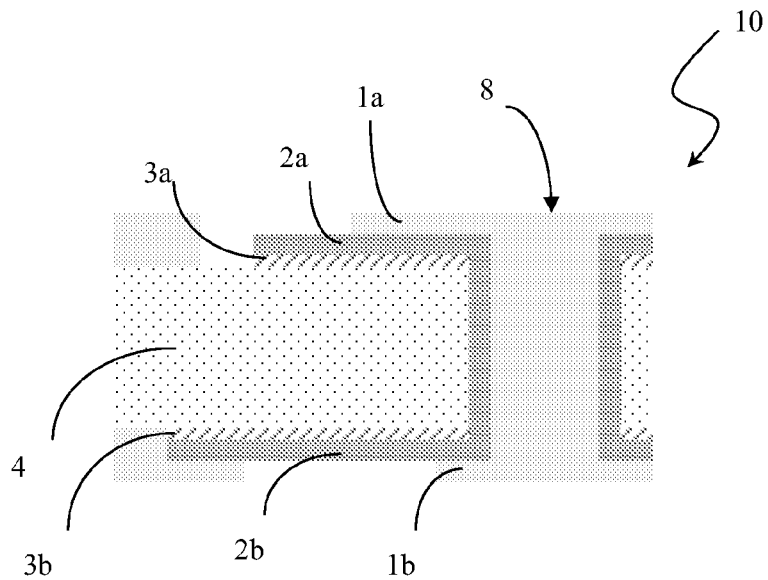
FIG. 1 is a schematic representation of a package substrate according to the prior art.
Figure 2:
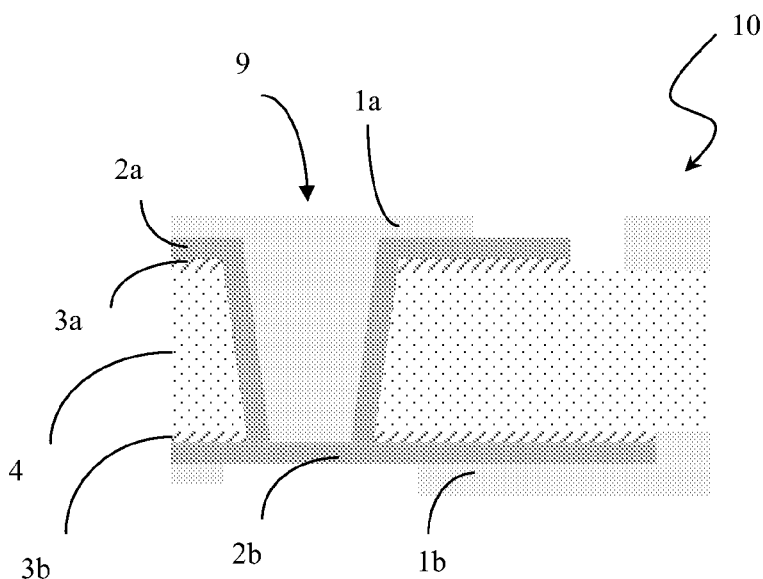
FIG. 2 is a schematic representation of an alternative package substrate according to the prior art.

Components that are functionally or structurally similar or equivalent to those of FIGS. 1 and 2 will be indicated by the same reference numeral, increased by 10.

The semiconductor package substrate 20 according to this embodiment of the disclosure includes a core 14 made of BT resin as according to conventional techniques in the field. The core 14 comprises an upper surface 14a, whereover a device 21, in particular a semiconductor device such as a MEMS device, will be supported and an opposite lower surface 14b.

As already described with reference to the prior art examples, both such upper and lower surfaces of the core 14, 14a and 14b, are coated with at least one pair of metal layers 12a, 13a and 12b, 13b, respectively, on each opposite surfaces.

Such metal is copper (Cu), with a finishing in NiAu, and the number of layers, which is always an even number, can range from 2 to 8, preferably 2.

The outer metal layers 12a and 12b are then coated with one pair of solder mask layers 11a, 11b, one on each of the opposite outer copper coated surfaces, again, according to conventional techniques.

A plurality of vias 19 is then formed through the semiconductor package substrate 20 so that the core 14, and the metal coating layers 12a, 12b, 13a, 13b are perforated throughout. In particular, the vias 19 are preferably provided as plated through holes, or PTH. Then, the solder mask layers are deposited on the semiconductor package substrate 20.

According to this embodiment of the disclosure, the vias 19 are positioned so that they are distributed according to a homogeneous pattern in an area 21a that is to be covered by the device 21.

Figure 3:
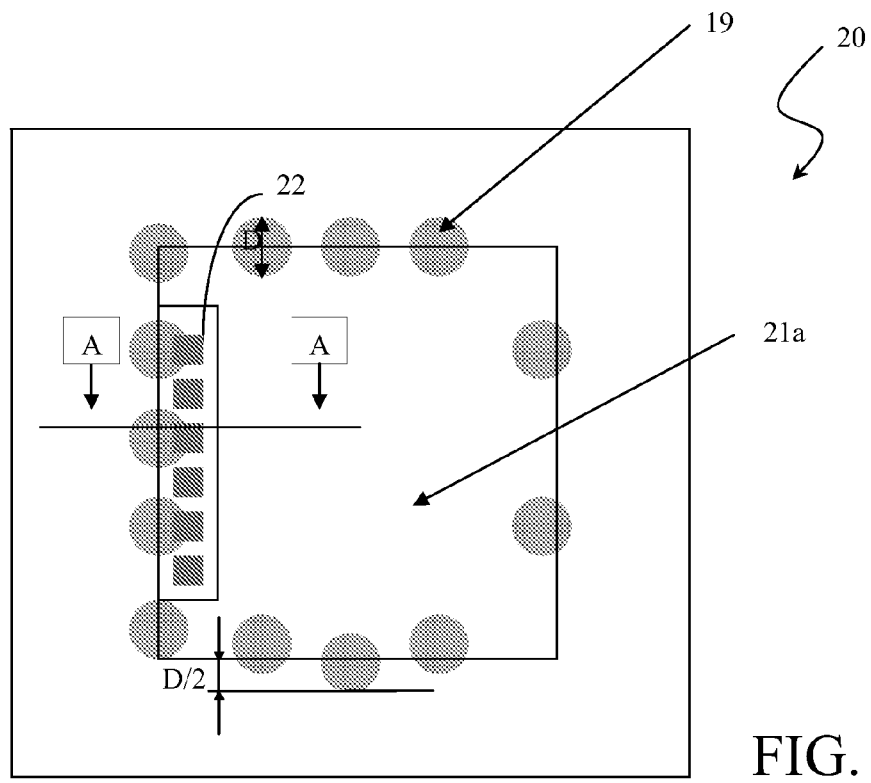
FIG. 3 is a schematic representation of a package substrate according to one embodiment of the disclosure.
Figure 4:
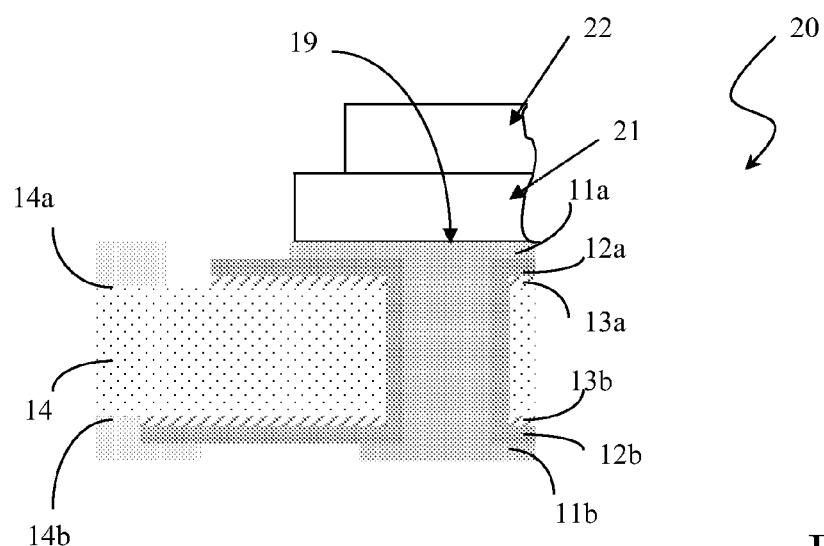
FIG. 4 is a schematic cross section of a package including the package substrate of FIG. 3 cut along line A-A.

In particular, according to the first embodiment of the semiconductor package substrate 20 as shown in FIG. 3, the vias 19, are distributed so that they substantially coincide with the outline of the device 21 that the semiconductor package substrate 20 is intended to support. In such embodiment, the number of vias 19 on each side of the outline should be greater than 1. It should be noted that it is not necessary that the number of vias is the same on each side of the outline of the device 21, as long as they are substantially positioned along such an outline.

It should be also noted that by substantially what is meant is that the vias are to be positioned in such a way that at least one half of the corresponding via land (i.e., the metallization around the via drill) is positioned inside the area 21a.

As clearly seen in FIG. 3, when considering round vias having a via land of diameter D, and a straight portion of the area 21a, the vias are positioned in such a way that no more than one half of the via land diameter sits outside such area.

Suitable semiconductor devices 21 can be MEMS, ASICs, and in general all devices sensitive to mechanical stresses, such as MEMS devices.

A cap or molding compound 22 encapsulating the semiconductor device 21 is also provided.

In a further embodiment of the semiconductor package substrate 20, dummy vias are used in those circumstances where the number of vias 19 actually required is smaller than two per outline side.

Figure 5:
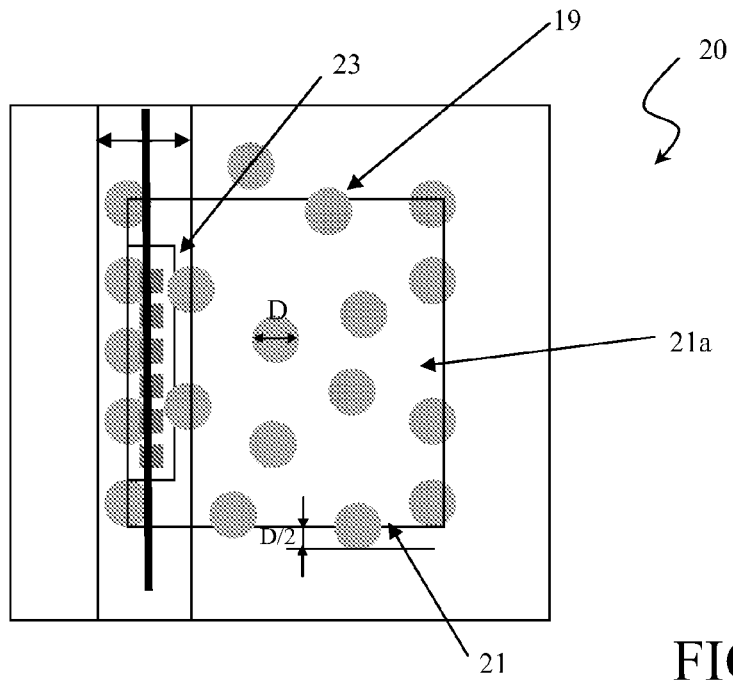
FIG. 5 is a schematic representation of a package substrate according to a second embodiment of the disclosure.

According to a second embodiment of the semiconductor package substrate 20 as shown in FIG. 5, the semiconductor device 21 is small with respect to the number of vias 19 required or with respect to the routing requirements. In such case, a majority of the vias 19 are homogeneously positioned in the area 21a that is to be covered by the semiconductor device 21. In particular, at least two vias 19 are positioned in a security area A surrounding a pad line 23.

In fact, it is worth noting that such a pad line 23, which can be freely positioned within the area 21a according to need, is a critical portion of a package comprising the semiconductor device 21, the delamination of the cap 22 being extremely high in this portion.

According to this second embodiment of the semiconductor package substrate 20, the vias 19 are thus distributed in order to ensure an effective "covering" of the critical portion corresponding to the pad line 23.

Figure 6:
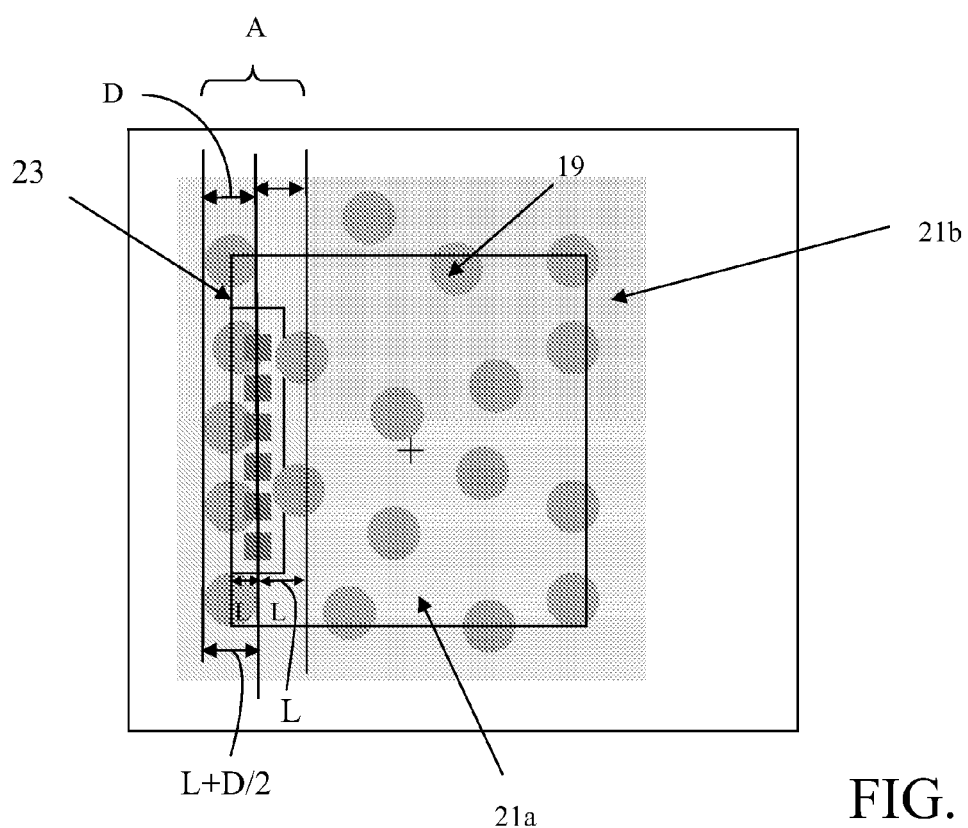
FIG. 6 is a schematic representation of the package substrate according to the second embodiment of the disclosure.

In particular, in the case of small devices and where, owing to routing needs, it is not possible to place vias along the outline of area 21a, the majority of vias are positioned in an area 21b being bigger than the area 21a, preferably 40% bigger than the area 21a and centered with it, as shown in FIG. 6. Moreover according to this second embodiment, at least two vias must be placed over the security area A within a range of ±(L+D/2) from the center of the pad line 23, where 2L is the pad opening width of the die and D is the diameter of the via land.

Also in this case, dummy vias can be added so as to respect these rules.

Figure 7:
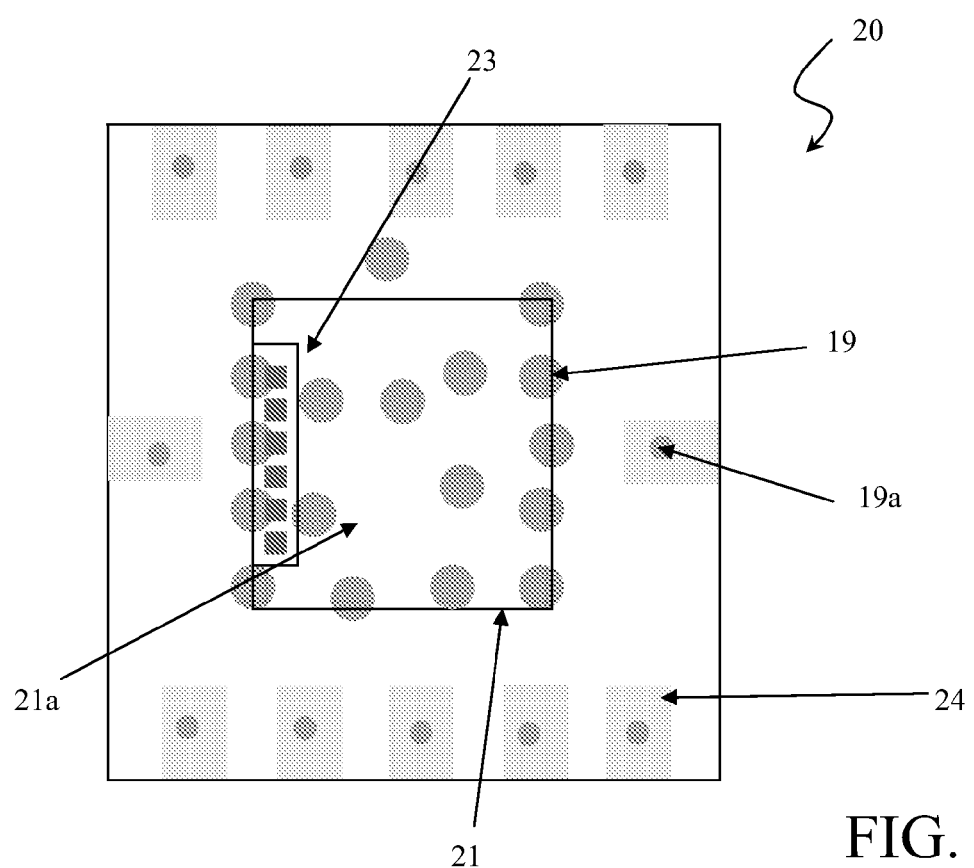
FIG. 7 is a schematic representation of a package substrate according to a third embodiment of the disclosure.

A third embodiment of the semiconductor package substrate 20 is shown in FIG. 7, the number of vias 19 required is too large to be included in the area 21a to be covered by the semiconductor device 21. In this case, the additional vias 19a are positioned in lands 24.

In one embodiment, such additional vias 19a are realized using VIP (vias in pad) technology.

As above, dummy vias are also used in those circumstances where the number of vias 19 required is smaller than that necessary to provide the best stability.

Whenever necessary, a combination of the three embodiments described may be used to better meet the specific requirements of the case.

Embodiments of the present disclosure also relate to methods for the production of a semiconductor package substrate 20 suitable for supporting a damage-sensitive device 21. One such method includes providing a package substrate core 14 having an upper and a lower surface, 14a, 14b. At least one pair of copper layers, 12a, 12b and 13a, 13b, is deposited on the upper and lower surfaces, 14a, 14b, of the core 14. One pair of solder mask is deposited on one pair of metal, preferably copper, layers, 11a, 11b, on outer layers, 12a, 12b, of the at least one pair of copper layers, 12a, 12b and 13a, 13b. A plurality of vias 19 is formed through the core 14 and one pair of copper layers, 12a, 12b, 13a, 13b.

The step of forming the plurality of vias 19 may distribute them according to a homogeneous pattern in the area 21a that is to be covered by the device 21. The distribution of the plurality of vias 19 may thus be made as above explained with reference to the embodiments shown in FIGS. 3 to 7. A damage-sensitive device 21 is then mounted on top of the upper solder mask layer 11a and wire connections between the package substrate 20 and the damage-sensitive device 21 are carried out. A semiconductor package including the package substrate 20 and the damage-sensitive 21 may then be sealed with the sealant cap 22.

Example 1

An LGA/BGA semiconductor package substrate was composed of a BT resin core as according to conventional techniques in the field. The substrate comprised an upper surface, solder mask, destined to support a MEMS device and an opposite lower surface.

Both such surfaces were then coated with two copper layers on each opposite surfaces according to conventional techniques.

Eight vias were then formed through the substrate so that the core and the copper layers were perforated throughout. The vias were positioned so that they would be found beneath the outline of the MEMS device it was intended to support, two for each of the four sides of the MEMS device.

A solder mask was then deposited on the LGA/BGA semiconductor package substrate.

The MEMS device was then mounted on top of the solder mask layer of the upper core surface and wire connections between the substrate and the MEMS device were carried out.

The semiconductor package was then sealed with a sealant cap or molding compound.

It was found that such package gave good functioning performance in the long term in terms of offset stability and drift, given by the fewer cap delamination and loss of sealing effect risks during assembly, in particular during molding.

Example 2

An LGA/BGA semiconductor package substrate was composed of a BT resin core as according to conventional techniques in the field. The core comprised an upper surface, destined to support a MEMS device and an opposite lower surface.

Both such surfaces were then coated with two copper layers on each opposite surfaces according to conventional techniques.

Nineteen vias were then formed through the substrate so that the core and the copper plating layers were perforated throughout. The vias were positioned so that they would be found beneath the outline of the MEMS device it was intended to support, as well as throughout the area within such outline. Two vias were positioned in the area ±300 μm with respect to the pad line.

A solder mask was then deposited on the LGA/BGA semiconductor package substrate.

The MEMS device was then mounted on top of the solder mask layer of the upper core surface and wire connections between the substrate and the MEMS device were carried out.

The semiconductor package was then sealed with a sealant cap or molding compound.

It was found that such package gave good functioning performance in the long term in terms of offset stability and drift, and an assembly yield increase given by the fewer cap delamination and loss of sealing effect, in particular during molding.

Example 3

An LGA/BGA semiconductor package substrate was composed of a BT resin core as according to conventional techniques in the field. The substrate comprised an upper surface, solder mask, destined to support a MEMS device and an opposite lower surface.

Both such surfaces were then coated with two copper layers on each opposite surfaces, according to conventional techniques.

Thirty vias were then formed on the substrate so that the core and the copper plating were perforated throughout. The vias were positioned so that they would be found beneath the outline of the MEMS device it was intended to support, throughout the area within such outline, as well as outside such outline, on the lands. The vias were positioned on the lands using VIP technology.

A solder mask was then deposited on the LGA/BGA semiconductor package substrate.

The MEMS device was then mounted on top of the solder mask layer of the upper core surface and wire connections between the substrate and the MEMS device were carried out.

The semiconductor package was then sealed with a sealant cap or a moulding compound.

It was found that such package gave good functioning performance in the long term in terms of offset stability and drift, given by the fewer cap delamination and loss of sealing effect risks during assembly, in particular during molding.

It is envisaged that semiconductor packages, and therefore the respective positions of the package devices with respect to the IC, can take on any of the configuration known in the field (side by side, stacked, inverse stacking, etc.). In such cases, the above description should be modified according to the requirements.

In conclusion, embodiments of the present disclosure provide improved semiconductor package substrates which are capable of better withstanding the mechanical stresses caused by the assembly steps of the production line.

It has been found, in fact, that by distributing the vias according to the homogeneous pattern according to an embodiment of the disclosure, the package substrate becomes more stable and can undergo the assembly steps without suffering from the common problem of delamination of the cap and loss of the seal effect. The result is a package substrate which is suitable to support stress-sensitive devices such as MEMS and the like during assembly and is thus capable of ensuring good performance of the device in the long term.

MEMS or other devices contained in semiconductor package substrates according to embodiments of the present disclosure may be contained in a variety of different types of electronic systems, such as video display systems, televisions, bar code scanners, and so on.

From the foregoing it will be appreciated that, although specific embodiments of the disclosure have been described herein for purposes of illustration, various modifications may be made without deviating from the spirit and scope of the disclosure.

The invention claimed is:

1. A semiconductor package substrate suitable for supporting a damage-sensitive device, comprising:
   a package substrate core having an upper and a lower surface;
   at least one pair of metal layers coating the upper and lower surfaces of the package substrate core in a first area covered by the damage-sensitive device, wherein an outline of the first area completely coincides with edges of the damage-sensitive device;
   one pair of solder mask layers coating the outer metal layers of the one pair of metal layers; and
   a plurality of vias formed across the package substrate core and the at least one pair of metal layers, wherein the plurality of vias is substantially distributed according to a homogeneous pattern in a second area that is bigger than the first area and smaller than the package substrate core such that the number of vias within the first area is substantially equal to the number of vias outside the first area and such that the plurality of vias is substantially distributed throughout the entire second area and not outside the second area;
   wherein the number of vias on each side of the outline is the same and the number is greater than 1; and
   wherein the vias are positioned so that the majority of the vias are homogeneously positioned within the second area which is bigger than the first area, and wherein the second area is approximately 40% bigger than the first area and centered with the first area.

2. The semiconductor package substrate of claim 1 wherein at least two vias are positioned in a security area surrounding a pad line of the damage-sensitive device.

3. The semiconductor package substrate of claim 2 wherein the security area covers a distance of $\pm(L+D/2)$ from the center of the pad line, where 2L is a pad opening width and D is a diameter of a via land.

4. The semiconductor package substrate of claim 1 wherein additional vias are positioned in lands outside both the first and second areas.

5. The semiconductor package substrate of claim 1 wherein the substrate further includes dummy vias.

6. The semiconductor package substrate of claim 1 wherein the package substrate core is a BT resin.

7. The semiconductor package substrate of claim 1 wherein the at least one pair of metal layers is copper.

8. The semiconductor package substrate of claim 1 wherein the number of the metal layers is between 2 and 8.

9. The semiconductor package substrate of claim 1 wherein the at least one pair of solder mask layers is epoxy resin.

10. The semiconductor package substrate of claim 1 wherein the damage-sensitive device is a MEMS device.

11. A semiconductor package, comprising:
    a package substrate having an upper surface and a lower surface, the package substrate being adapted to support a device and the package substrate further including a plurality of vias extending through the package substrate from the upper surface to the lower surface;
    wherein the vias being arranged in a homogenous pattern throughout a first contiguous area that is approximately 40% larger than the area of the device to be attached and such that the area of the device is centered within the first contiguous area and smaller than the package substrate such that the number of vias arranged within the area of the device is approximately equal to the number of vias arranged without the area of the device, and wherein the vias are arranged only in the first contiguous area and arranged for reducing stresses experienced by the device during subsequent manufacturing steps of the semiconductor package.

12. The semiconductor package of claim 11 wherein the pattern corresponds to an even distribution of the vias within the first area.

13. The semiconductor package of claim 11 wherein the pattern includes dummy vias.

14. The semiconductor package of claim 11 wherein the area of the device to be attached is defined by a periphery of the device, and wherein the pattern of vias includes vias positioned to substantially coincide with the periphery of device.

15. The semiconductor package of claim 14 wherein the device has a plurality of sides and wherein the pattern includes for each side of the device at least one via positioned to substantially coincide with the corresponding side of the device.

16. The semiconductor package of claim 11 wherein the first area is approximately 40% larger than the area of the device to be attached.

17. The semiconductor package of claim 11,
wherein the package substrate includes,
a package substrate core having an upper surface and a lower surface;
at least one pair of metal layers coating the upper and lower surfaces of the package substrate core; and
one pair of solder mask layers coating the outer metal layers of the one pair of metal layers; and
wherein the plurality of vias is formed extending through the package substrate core and each pair of metal layers.

18. The semiconductor package of claim 11 further comprising the device attached to the package substrate.

19. The semiconductor package of claim 18 wherein the device comprises a MEMS device.

20. The semiconductor package of claim 11 wherein the package substrate comprises a land grid array.

21. The semiconductor package of claim 11 wherein the package substrate comprises a ball grid array.

22. An electronic system, comprising:
electronic circuitry operable to perform a desired function, the electronic circuitry including a semiconductor package with a package substrate having an upper surface and a lower surface coated by a pair of metal layers, the package substrate being adapted to support a device and the package substrate further including a plurality of vias extending through the package substrate from the upper surface to the lower surface and though the pair of metal layers;
wherein the vias are arranged within and not outside of a support area that is greater than the area of the device to be attached to the package substrate, the vias having a pattern that is configured to reduce stresses experienced by the device during manufacturing steps of the semiconductor package that occur subsequent to the device being attached to the package substrate;
wherein the vias are positioned so that the majority of the vias are homogeneously positioned within the support area which is bigger than the area of the device, and wherein the support area is approximately 40% bigger than the area of the device and centered with the area of the device.

23. The electronic system of claim 22 wherein the electronic circuitry comprises one of television, bar code scanning, and video display circuitry.

* * * * *